Aug. 5, 1958

E. WOLFENDALE 2,846,579

ELECTRIC OSCILLATOR CIRCUIT

Filed April 5, 1955

INVENTOR
ERIC WOLFENDALE
BY [signature]
AGENT 2,846,579

ELECTRIC OSCILLATOR CIRCUIT

Eric Wolfendale, Horley, England, assignor, by mesne assignments, to North American Philips Company, Inc., New York, N. Y., a corporation of Delaware Application April 5, 1955, Serial No. 499,448

Claims priority, application Great Britain April 5, 1954

2 Claims. (Cl. 250—36)

The present invention relates to a circuit arrangement for producing sinusoidal or substantially sinusoidal electrical oscillations. More particularly, the invention relates to a circuit arrangement for producing sinusoidal or substantially sinusoidal electrical oscillations by means of a transistor having a current amplification factor between the emitter and the collector of less than 1, for example by means of a junction transistor.

A junction transistor may, for example, be used with grounded emitter electrode, with a parallel resonant circuit in the collector circuit and with an inductive feedback to the base electrode. In this circuit arrangement the amplitude of the oscillations is limited on the one hand by current saturation in the collector circuit and on the other hand by interruption of the collector current. The difference between the operation of the transistor and that of an electron tube resides in the fact that the input impedance of the transistor varies abruptly to a great extent, for example from about 600 ohms to about 0.5 megohm, when the condition is attained, in which the collector current ceases to flow. At the instant when collector current starts to flow again, the strongly reduced input impedance of the transistor damps the parallel resonant circuit, so that the positive half waves are strongly reduced relative to the negative half waves of the oscillations and hence the resultant oscillations are strongly distorted.

These distortions may be reduced by including a resistor between the emitter and ground. The input impedance during the half waves, when the transistor is traversed by current, is raised by this resistor, which produces, moreover, a certain degree of negative feed-back. If this resistor is chosen to be sufficiently high, the oscillations produced are substantially sinusoidal, but such an arrangement has the disadvantage that the amplitude of the oscillations is reduced.

A further method of reducing the distortions consists in reducing the ratio $L:C$ of the oscillator circuit. If the resonance impedance of the oscillator circuit is chosen to be lower than the input impedance of the transistor, viewed from this circuit, during the half waves, when collector current flows, the abrupt variations of the input impedance exert little influence on the waveform of the oscillations. This arrangement has the advantage that the amplitude of the oscillations is not reduced to such a high extent as with the aforesaid emitter resistor, but the higher value of the capacitor may be an objection, for example, when the generator must be adjustable to different frequencies.

The variation of the input impedance of the transistor is due to the fact that the base electrode becomes positive relative to the emitter. The excitation in the positive range is to be attributed to the voltage-dependent feedback, when parallel resonant circuits are used.

In accordance with the invention the collector circuit of the transistor comprises a series resonant circuit, and a regenerative feed-back to the base electrode of the transistor is provided.

Since a series resonant circuit is used, the feed-back is current-dependent, so that the said disadvantages of the arrangements comprising parallel resonant circuits are avoided.

The invention will now be described with reference to the accompanying drawing, in which.

Figure 1:
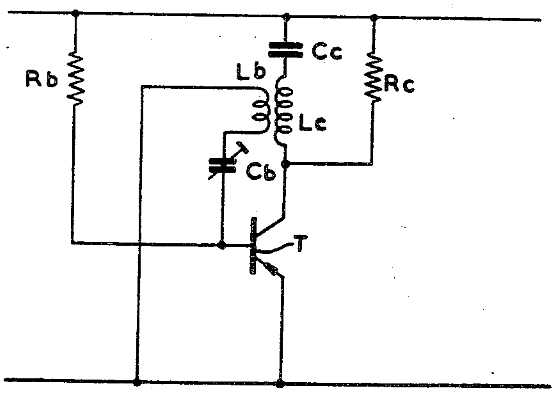
Fig. 1 is a schematic diagram of an embodiment of the circuit arrangement of the present invention.
Figure 2:
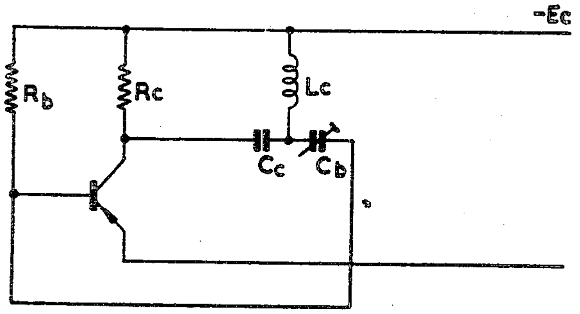
Fig. 2 is a schematic diagram of another embodiment of the circuit arrangement of the present invention.

In Figs. 1 and 2 the corresponding elements are designated by the same reference numerals.

The embodiment shown in Fig. 1 comprises a series resonant circuit $Lc$, $Cc$, included in the collector circuit of a transistor T.

A resistor $Rc$ is connected in parallel with the series resonant circuit in order to obtain a direct-current path for the collector current. A secondary coil $Lb$ is coupled with the coil $Lc$ of the oscillator circuit and exhibits the sense of winding, with which a regenerative feed-back is obtained. Thus, and by connecting a capacitor $Cb$ in series with the coil $Lb$ and by adjusting it to resonance, a base current with a phase shift of 180° relative to the collector current may be obtained, in which case the oscillations in the collector circuit are sinusoidal or substantially sinusoidal.

Fig. 2 shows a similar arrangement to that of Fig. 1, which, however, is simpler and does not comprise a transformer. The feed-back is obtained by means of the capacitor $Cb$. It is clearly evident that the reactances $Cc$, $Lc$ and $Cb$ constitute a high-pass filter. This filter may exhibit a poor adaption and high losses. In order to account for the operation it will, however, be assumed that the filter is well adapted and operates without losses.

Figure 3:
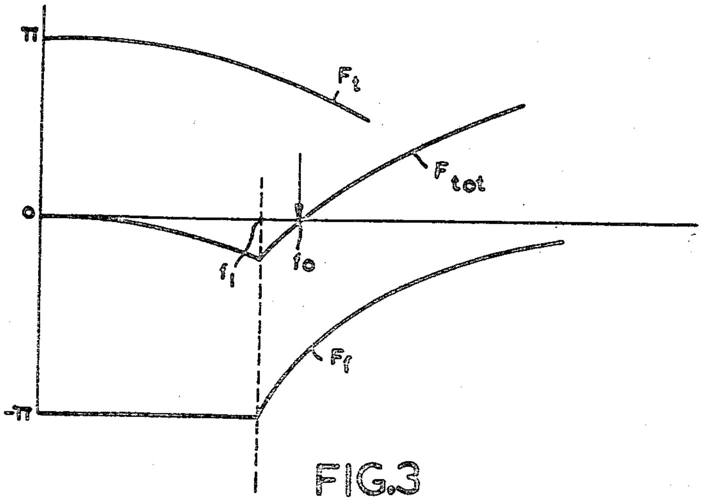
Fig. 3 is a graphical presentation of electrical phase curves for the embodiment of Fig. 2.

Fig. 3 shows the phase ratios and is based on the aforesaid assumption. The oscillations produced have such a frequency $f_0$ that the phase shift in the filter (curve F) is zero. This frequency slightly exceeds the cut-off frequency $f_1$ of the filter, so that it lies in the pass range. The frequency stability of the arrangement is satisfactory, if the slope of the phase characteristic curve of the filter (curve $F_f$) is steep at the working point. The frequency stability is improved according as the phase shift of the transistor itself (curve $F_t$) is smaller, i. e. at lower frequencies.

The arrangements shown in Figs. 1 and 2 permit the varying of the frequency of the oscillations within a small range by means of the capacitor $Cc$ without adjustment of the capacitor $Cb$. If the two capacitors $Cb$ and $Cc$ are adjusted, each of the arrangements shown permits the varying of the frequency of the oscillations within a large range.

What is claimed is:

1. A circuit arrangement for producing substantially sinusoidal oscillations comprising a transistor having emitter-collector and base electrodes and an emitter-collector amplification factor less than one, a first series resonant circuit coupled to said collector electrode, and a second series resonant circuit coupled to said base electrode comprising an inductor inductively coupled to said first series resonant circuit thereby producing a regenerative feedback to said base electrode and a capacitor connected in series with said inductor.

2. A circuit arrangement for producing substantially sinusoidal oscillations comprising a transistor having emitter, collector and base electrodes and an emitter-collector amplification factor less than one, a first series resonant circuit coupled to said collector electrode, and a second series resonant circuit coupled to said base electrode comprising an inductor inductively coupled to said first series resonant circuit thereby producing a regenerative feedback to said base electrode and a variable capacitor connected in series with said inductor whereby the amplitude and phase of the feedback voltage applied to said base electrode may be varied.

References Cited in the file of this patent

UNITED STATES PATENTS 2,750,508 Waldhaur ------------- June 12, 1956

OTHER REFERENCES

Article, "Transistor Circuitry," by Clay, pages 35–38 of Q. S. T. for December 1953.